(12) United States Patent
Austin et al.

(10) Patent No.: US 9,461,662 B2
(45) Date of Patent: Oct. 4, 2016

(54) SYSTEM FOR ANALYZING THE FREQUENCY OF A SIGNAL, A METHOD THEREOF AND A SYSTEM FOR MEASURING THE RELATIVE PHASE BETWEEN TWO INPUT SIGNALS

(71) Applicant: Michell Instruments Limited, Cambridgeshire (GB)

(72) Inventors: David Austin, Cambridgeshire (GB); Andrew M. V. Stokes, Cambridgeshire (GB); Michael Summers, Cambridgeshire (GB)

(73) Assignee: MICHELL INSTRUMENTS LIMITED, Ely (GB)

( * ) Notice: Subject to any disclaimer, the term of this patent is extended or adjusted under 35 U.S.C. 154(b) by 0 days.

(21) Appl. No.: 14/996,884

(22) Filed: Jan. 15, 2016

(65) Prior Publication Data
US 2016/0226505 A1 Aug. 4, 2016

(30) Foreign Application Priority Data
Jan. 29, 2015 (GB) .................................. 1501490.5

(51) Int. Cl.
*H03M 1/06* (2006.01)
*H03M 1/12* (2006.01)
(Continued)

(52) U.S. Cl.
CPC ............ *H03M 1/124* (2013.01); *G01R 23/167* (2013.01); *G01R 25/00* (2013.01); *H03H 21/002* (2013.01)

(58) Field of Classification Search
CPC ...... H03M 1/124; H03M 1/06; H03M 1/023; H03H 21/002; G01R 25/00; G01R 23/167
USPC ......................................... 341/118, 155, 156
See application file for complete search history.

(56) References Cited

U.S. PATENT DOCUMENTS 4,358,733 A * 11/1982 Hanahara ................ G10L 19/02
324/76.19
(Continued)

FOREIGN PATENT DOCUMENTS

EP          0481821 A2    4/1992
EP        0 523 263 A1    1/1993
(Continued)

OTHER PUBLICATIONS

A United Kingdom Search Report issued on Jun. 10, 2015, which is enclosed, that issued in the corresponding United Kingdom Patent Application No. GB15014905.
(Continued)

*Primary Examiner* — Jean B Jeanglaude
(74) *Attorney, Agent, or Firm* — Cowan, Liebowitz & Latman, P.C.; Steven D. Underwood

(57) ABSTRACT

There is provided a frequency analysis system, comprising: an analog to digital converter having a sampling frequency $f_s$; a first band pass filter and a second band pass filter, the first band pass filter and the second band pass filter being arranged in parallel with one another; and a feedback loop from an output to an input of the system, wherein the system has an initial center frequency equal to a nominal frequency $f_0$, and a revised center frequency dependent upon the output of the system that is fed back into the input of the system, wherein the transfer functions of the first and second band pass filters have the same poles, and wherein the system is configured such that, when the center frequency $f_c$ equals the frequency of the signal $f_i$, the output of the first band pass filter is in phase with the input, the output of the second band pass filter lags the output of the first band pass filter at a constant phase of $$\frac{\pi}{2},$$

and the two band pass titers have equal gain amplitude. There is also provided a method for analyzing the frequency $f_i$ of a signal and a phase measurement system based on the frequency analysis system.

21 Claims, 3 Drawing Sheets

(51) Int. Cl.
*H03H 21/00* (2006.01)
*G01R 23/167* (2006.01)
*G01R 25/00* (2006.01)

(56) References Cited

U.S. PATENT DOCUMENTS

| | | | |
|---|---|---|---|
| 4,674,125 A * | 6/1987 | Carlson | G01R 23/167 375/E7.04 |
| 5,649,018 A | 7/1997 | Gifford et al. | |
| 6,917,252 B1 | 7/2005 | Wyszynski | |
| 6,930,565 B1 | 8/2005 | Vishinsky | |
| 8,140,283 B2 * | 3/2012 | Benmouyal | G01R 19/2513 324/76.39 |
| 2007/0132442 A1 | 6/2007 | Jones | |

FOREIGN PATENT DOCUMENTS

| | | |
|---|---|---|
| EP | 2 772 766 A2 | 9/2014 |
| GB | 2256993 A | 7/1992 |

OTHER PUBLICATIONS

The above patent documents were cited in a European Search Report dated Jul. 6, 2016, which is unclosed, that issued in a related in the corresponding European Patent Application No. 16153386.4.

* cited by examiner

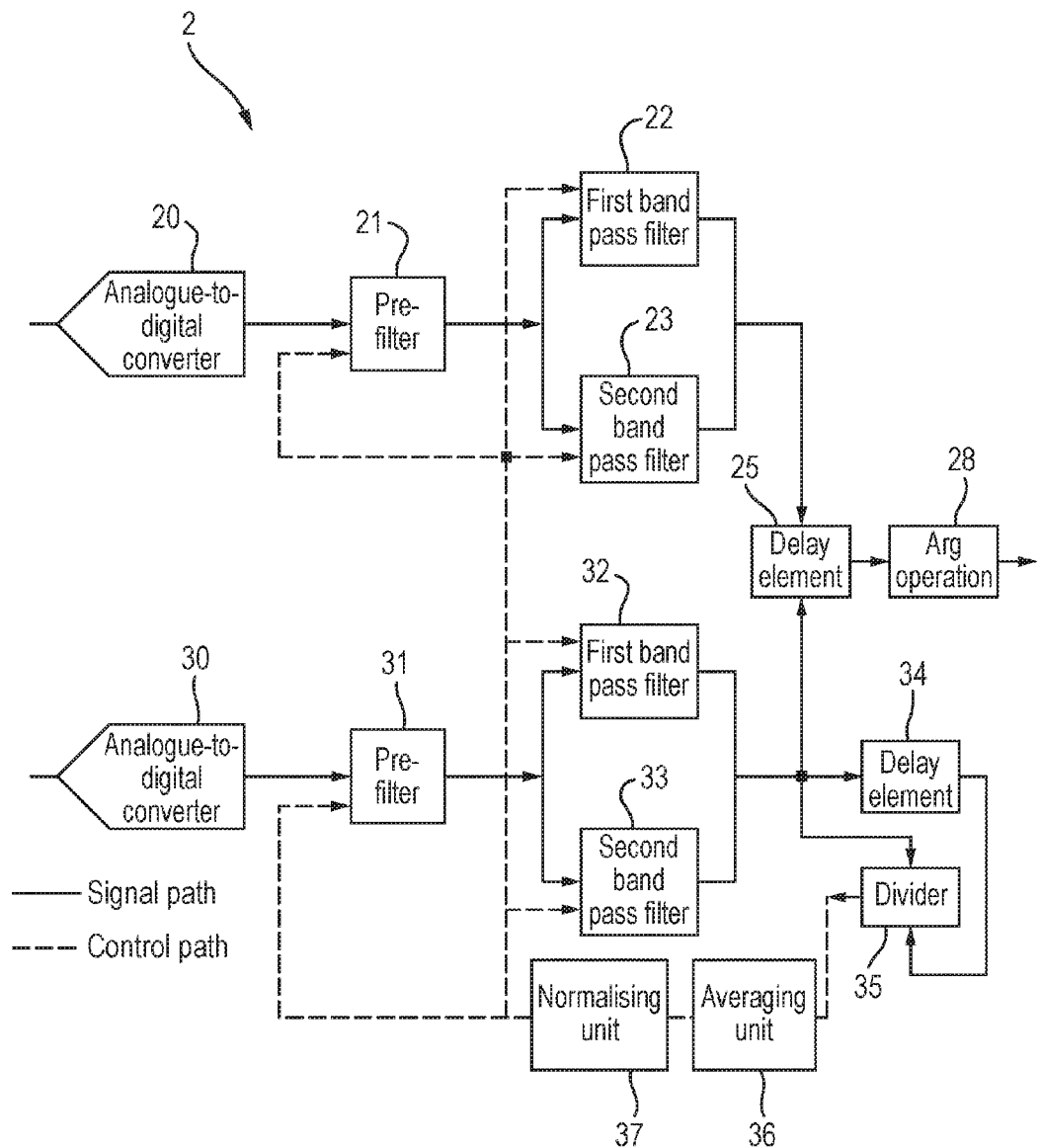

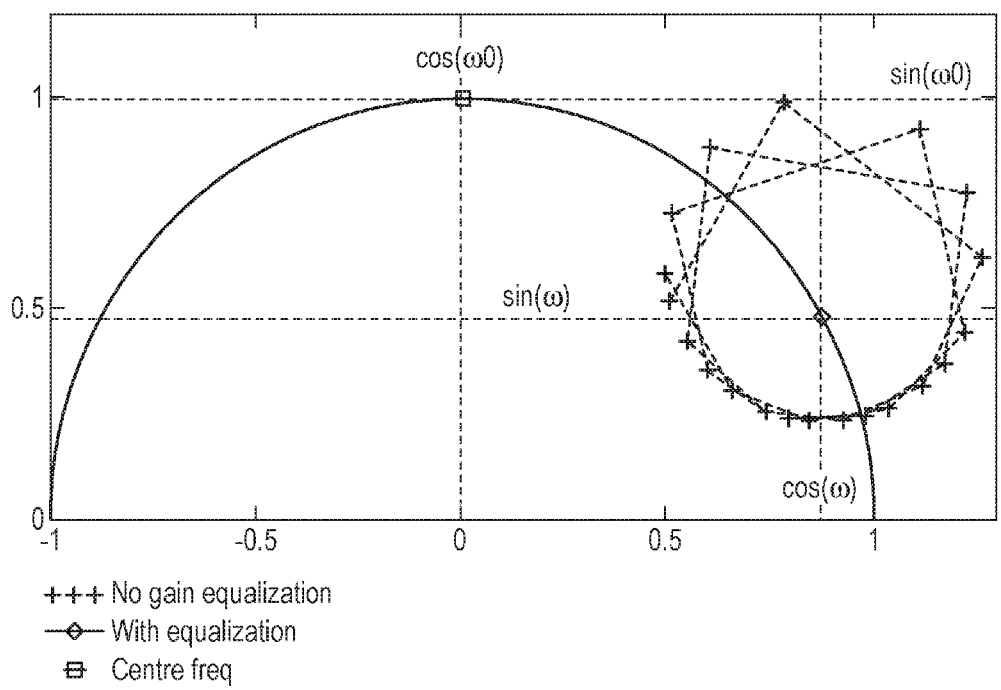

SYSTEM FOR ANALYZING THE FREQUENCY OF A SIGNAL, A METHOD THEREOF AND A SYSTEM FOR MEASURING THE RELATIVE PHASE BETWEEN TWO INPUT SIGNALS

The present invention relates to a digital signal processing system for analysing the frequency of a signal, a method for the same, and a system for measuring the relative phase between two input signals. More particularly, it relates to a frequency analysis system with an arrangement of adaptive filters, a method for using said system to achieve rapid input frequency measurements, and a phase measurement system based on the frequency analysis system.

Frequency analysis techniques are used in a wide range of applications, a common one being tracking and synchronisation of signals to mains frequency in power generation control. The operating frequency of a signal in an electric power system may often fluctuate around its nominal AC frequency (for example, 50 Hz in the UK) by the influence of the load, the generator(s), transformers, etc. In order that the operating frequency may be brought back in line with the nominal frequency, systems for frequency tracking are employed to measure the operating frequency such that the correct adjustments can be made. Other applications of frequency analysis systems that employ frequency tracking techniques include medical applications such as ECG and measurement of other biological waveforms, demodulating an FM radio signal, decoding data from a frequency shifted bit steam, and tracking rotations of an engine, for example.

In some known frequency analysis methods, the frequency of a signal may be determined by sampling a signal at a sampling rate, measuring the frequency of the signal, and then modifying the sampling rate to correspond to the measured frequency (see, for example, US 2010/0161263 A1). Generally speaking, the sampling rate is set to be an integer multiple of the nominal frequency of the signal, for example, at the Nyquist rate, so that aliasing may be avoided.

In known frequency analysis methods, maximisation of periodograms, maximisation of the residual sum of squares, maximum likelihood approach, and sample covariance techniques have all been used traditionally. More recently, algorithms that allow phasors to be obtained that represent each of the three phases in a three-phase system have been used in digital filters, for example, such as Gaussian filters, Fourier filters, Kalman filters or Cosine filters, to extract the operating frequency from the signal.

However, frequency analysis systems using these known frequency analysis methods are often not very accurate and they can take too long to lock onto the correct frequency. Accordingly, there is an ongoing desire for an improved frequency analysis system and method.

In accordance with an aspect of the present invention, there is provided a frequency analysis system, comprising: an analogue to digital converter having a sampling frequency $f_s$; a first band pass filter and a second band pass filter, the first band pass filter and the second band pass filter being arranged in parallel with one another; and a feedback loop from an output to an input of the system, wherein the system has an initial centre frequency equal to a nominal frequency $f_0$, and a revised centre frequency dependent upon the output of the system that is fed back into the input of the system, wherein the transfer functions of the first and second band pass filter have the same poles, and wherein the system is configured such that, when the centre frequency $f_c$ equals the frequency of the signal $f_i$, the output of the first band pass filter is in phase with the input, the output of the second band pass filter lags the output of the first band pass filter at a constant phase of $$\frac{\pi}{2},$$

and the two band pass filters have equal gain amplitude.

An analogue signal with frequency $f_i$ is input into the system of the present invention and it is sampled at a constant rate $f_s$ by the analogue to digital converter, which can be set by the user. The digital signal that is output from the analogue to digital converter is passed through two parallel digital band pass filters. Each of said filters has a centre frequency $f_c$ that is adapted by the system to match the input frequency of the signal. The centre frequency and the selectivity of each of the filters are controlled by adaptive parameters and said adaptive parameters may be common to each of the band pass filters. It will be appreciated that in some cases, the frequency that the system locks onto may not necessarily be the input frequency of interest, for example, there may be harmonics or unrelated frequencies present in the input signal. The more selective the band pass filters are by virtue of its adaptive parameters, then the more like the system is to lock onto the frequency of interest at the outset.

The two parallel band pass filters may be infinite impulse response (IIR) filters whose impulse response never decays to zero. The arrangement of the two adaptive band pass filters that are in parallel with one another and have quadrature phase, i.e. that are $$\frac{\pi}{2}$$

out of phase with one another, when the centre frequency of the system equals the input frequency allows the system of the present invention to achieve greatly improved frequency tracking accuracy as well as very fast convergence towards the input frequency. When the centre frequency of the system is shifted away from the input frequency, the gain magnitude of each of the parallel band pass filters can be different and depend on at least a parameter of their respective transfer functions. However, by using the arrangement and configuration of band pass filters according to the present invention, the gains of the band pass filters are equalised when the centre frequency equals the input frequency. An estimate of the averaged and normalised ratio of successive outputs of the system may be derived after each time the output is sampled rather than after a number of complete cycles. This results in greatly improved estimates of the phase angle increment per sample and therefore very fast convergence to the input frequency.

Preferably, the first band pass filter and/or the second band pass filter may have unity gain when the centre frequency of the system equals the input frequency. With unity gain for both of the parallel band pass filters, the amplitude of the input may be determined advantageously by taking the modulus of the output.

A pre-filter may be arranged in series with and before the two parallel band pass filters and said pre-filter may act to remove any DC component and noise from the signal. It may be a band pass filter itself.

Preferably, the output of the system may be the combination of the outputs of the two band pass filters.

Preferably, the system may further comprise a gain equaliser arranged such that the output of the system is the combination of the gain equalised outputs of the two band pass filters. This advantageously speeds up the convergence of the centre frequency towards the input frequency. The gain equaliser reduces the variance of the estimate of the input frequency derived from the system.

Preferably, the output of the second band pass filter may lag the output of the first band pass filter at a constant phase of $$\frac{\pi}{2}$$

at all centre frequencies of system.

Preferably, the output of the system may be a phasor. The phasor may preferably be the complex combination of the gain equalised outputs of the two band pass filters.

Preferably, the two band pass filters may each have parameters $c=\cos(\omega_c)$ and $s=\sin(\omega_c)$, wherein $$\omega_c = 2\pi \cdot \frac{f_c}{f_s},$$

and said parameters c and s are revised according to the averaged and normalised ratio of successive outputs of the system.

Preferably, the frequency $f_i$ of the input signal may be calculated according to:

$$f_i = \frac{f_s}{2 \cdot \pi} \arg(c + j \cdot s)$$

wherein $f_s$ is the sampling frequency, $c=\cos(\omega_c)$, $s=\sin(\omega_c)$, $$\omega_c = 2\pi \cdot \frac{f_c}{f_s}$$

and c+j.s is the averaged and normalised ratio of successive outputs of the system.

Preferably, the sampling frequency of the system may be at least two times the initial centre frequency. In other words, the input signal is sampled at the Nyquist rate or higher, which ensures alias free sampling.

Preferably, the pre-filter and each of the band pass filters may have selectivity based upon the pole radius r of each of their respective transfer functions, and wherein 0≤r≤1. As the centre frequency of the system converges to the input frequency, the value of r may be increased in order to make the filter(s) more selective. This is especially useful because the input signal may contain harmonics, and increasing the selectivity of the filter(s) advantageously allows the system to select one harmonic and reject the others.

In accordance with another aspect of the present invention, there is also provided a phase measurement system, comprising two frequency analysis systems as described above, wherein the relative phase of the two input signals is found by dividing the phasors of the two outputs.

In each of the above embodiments, the frequency analysis system may be a frequency tracking system for tracking the input frequency of a signal.

In accordance with another aspect of the present invention, there is also provided a method for analysing the frequency $f_i$ of a signal, comprising: inputting a signal with frequency $f_i$ into a system, wherein the system comprises an analogue to digital converter having a sampling frequency $f_s$, a first band pass filter and a second band pass filter, the first band pass filter and the second band pass filter being arranged in parallel with one another, and a feedback loop from an output to an input of the system; setting an initial centre frequency of the system equal to a nominal frequency $f_0$; sampling the signal at sampling frequency $f_s$ using the analogue to digital converter; feeding back the output of the system into the input; and revising the centre frequency $f_c$ of the system based on the output of the system, wherein the transfer functions of the first and second band pass filters have the same poles, and wherein the system is configured such that, when the centre frequency $f_c$ equals the frequency of the signal $f_i$, the transfer function of the first band pass filter is in phase with the input, the transfer function of the second band pass filter lags the transfer function of the first band pass filter at a constant phase of $$\frac{\pi}{2},$$

and the two band pass filters have equal gain amplitude.

Preferably, the steps of sampling, feeding back and revising the centre frequency $f_c$ may be iterated. Each time these steps are iterated, the centre frequency converges towards the frequency of the input signal.

The method may further preferably comprises using a pre-filter that is arranged in series with and before the two parallel band pass filters to remove any DC component and noise from the signal. It may be a band pass filter itself.

Preferably, the method may further comprise equalising the gains of the first and second band pas filters and combining the outputs of the two band pass filters such that the output of the system is the combination of the gain equalised output of the two band pass filters. This advantageously speeds up the convergence of the centre frequency towards the input frequency. The gain equaliser reduces the variance of the estimate of the input frequency derived from the system.

Preferably, the method may further comprise revising the parameters of the two band pass filters, $c=\cos(\omega_c)$ and $s=\sin(\omega_c)$, wherein $$\omega_c = 2\pi \cdot \frac{f_c}{f_s},$$

according to the averaged and normalised ratio of successive outputs of the system.

Preferably, the method may further comprise determining the frequency $f_i$ of the input signal of the signal according to:

$$f_i = \frac{f_s}{2 \cdot \pi} \arg(c + j \cdot s)$$

wherein $f_s$ is the sampling frequency, $c=\cos(\omega_c)$, $s=\sin(\omega_c)$, $$\omega_c = 2\pi \cdot \frac{f_c}{f_s}$$

and c+j.s is the averaged and normalised ratio of successive outputs of the system.

Preferably, the method may further comprise setting the sampling frequency at least at two times the initial centre frequency. As mentioned above, the input signal is sampled at the Nyquist rate or higher to ensure alias free sampling.

Preferably, the method may further comprise adjusting the selectivity of the pre-filter and each of the band pass filters based upon the pole radius r of each of their respective transfer functions, and wherein $0 \leq r < 1$. As mentioned above, as the centre frequency of the system increases, the value of r may be increased in order to make the filter(s) more selective. This is especially useful because the input signal may contain harmonics, and increasing the selectivity of the filter(s) advantageously allows the system to select one harmonic and reject the others.

Certain preferred embodiments of the present invention will now be described by way of example only with reference to the accompanying drawings, in which:

FIG. 2 illustrates a phase measurement system according to another embodiment of the present invention; and FIG. 3 is a graph showing the effect of gain equalisation.

Figure 1:
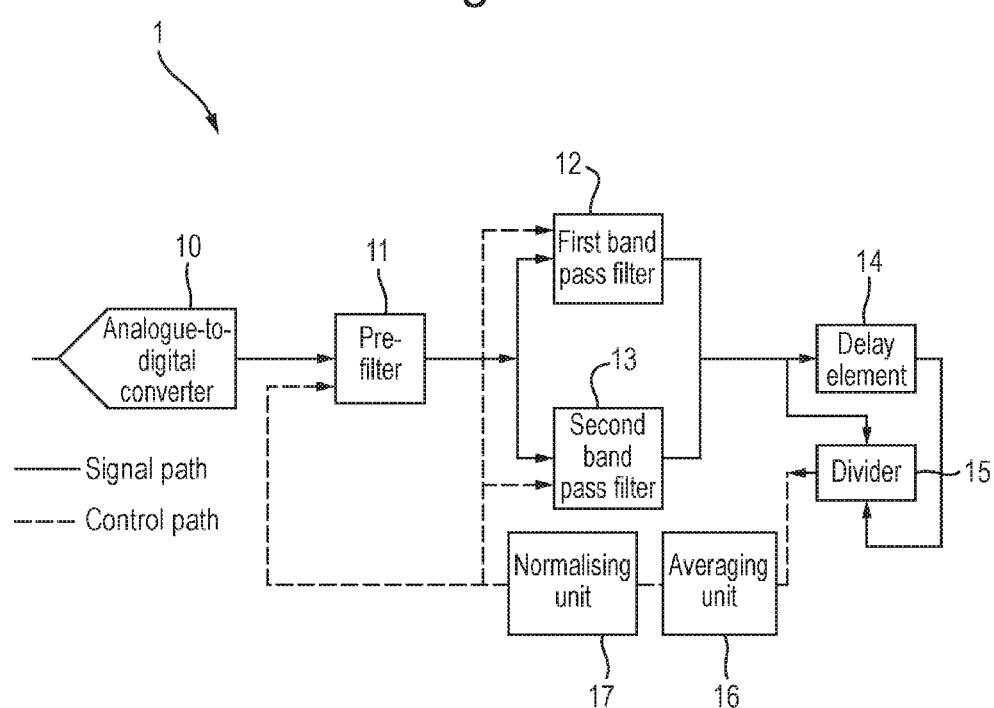
FIG. 1 illustrates a frequency analysis system according to one embodiment of the present invention.

In the example of FIG. 1, a frequency analysis system 1 according to the present invention is shown, comprising an analogue to digital converter 10 having a sampling frequency $f_s$, a pre-filter 11 (optional) having a transfer function $H_O(z)$, two parallel band pass filters arranged in series with and after the pre-filter, the first band pass filter 12 having a transfer function $H_I(z)$ and the second band pass filter 13 having a transfer function $H_Q(z)$. The outputs of band pass filters 12 and 13 are combined as real and imaginary parts respectively to give a complex phasor. The outputs of 12 and 13 may optionally be gain-equalised by a gain equaliser so that the phasors approximate a circle in the complex plane. Delay element 14 and divider 15 give the complex rotation of successive phasors. The complex rotations are averaged in block 16 and normalised to complex modulus=1 in block 17. The output of block 17 is c+j.s where c and s are the adjustable parameters of filters 11, 12 and 13. The frequency analysis system may be a frequency tracking system for tracking the input frequency of a signal.

The system 1 has a feedback loop from an output to an input of the system 1. The signal path is shown in solid lines and the control path is shown in dotted lines. The initial centre frequency of the system is equal to a nominal frequency $f_0$, and a revised centre frequency is found dependent upon the output of the system 1 that is fed back into the input of the system 1.

Some possible alternatives for the transfer function of the pre-filter are:

$$H_O a(z) = \frac{0.5 \cdot (1 - r^2) \cdot (z^2 - 1)}{z^2 - z \cdot c \cdot (1 + r^2) + r^2}$$

$$H_O b(z) = \frac{(1 - r^2) \cdot (c \cdot z - 1)}{z^2 - z \cdot c \cdot (1 + r^2) + r^2}$$

$$H_O c(z) = \frac{(1 - r^2) \cdot (z - 1)}{z^2 - z \cdot (2 \cdot c + r^2 - 1) + r^2}$$

where: $c = \cos(\omega_c)$, $s = \sin(\omega_c)$, $$\omega_c = \frac{2 \cdot \pi \cdot f_c}{f_s}.$$

The transfer functions for the first and second band pass filters 12, 13 may be, respectively:

$$H_I(z) = \frac{0.5 \cdot (1 - r^2) \cdot (z^2 - 1)}{z^2 - z \cdot c \cdot (1 + r^2) + r^2}$$

$$H_Q(z) = \frac{(1 - r^2) \cdot s \cdot z}{z^2 - z \cdot c \cdot (1 + r^2) + r^2}$$

The alternatives shown for $H_O(z)$ above each have gain 1 and phase 0 at the centre frequency. $H_O a(z)$ may be the same filter as $H_I(z)$, but it can be used with a different r (pole radius) value, and $H_O a(z)$ and $H_O(z)$ have equal gain magnitude at all frequencies. This is advantageous for very quick convergence of the output frequency of the frequency analysis system towards the input frequency.

In this example, $H_I(z)$ has two poles and two zeros, and $H_Q(z)$ has 2 poles and one zero. $H_I(z)$ and $H_Q(z)$ have the same complex conjugate poles, as seen by the denominator common to both transfer functions, and so the poles make no contribution to the phase difference between $H_I(z)$ and $H_Q(z)$. $H_I(z)$ has zeros at +1 and −1, contributing $(\pi+\omega)/2$ and $\omega/2$ respectively to the phase of $H_I(z)$. $H_Q(z)$ has a single zero at 0, contributing w to the phase of $H_Q(z)$. The phase difference $H_I(z) - H_Q(z)$ is therefore $$\left(\frac{\pi + \omega}{2} + \frac{\omega}{2}\right) - \omega = \frac{\pi}{2}$$

at any frequency $\omega$ ($0 < \omega < \pi$). The phase of $H_Q(z)$ lags $H_I(z)$ by $\pi/2$ at all frequencies, although the gain magnitudes are only equal at the centre frequency.

The selectivity of the filters 11, 12, 13 is controlled by the parameter r, the pole radius ($0 \leq r < 1$), which may be the same or different for each of the filters. When the system input is removed, the output decays with an $r^n$ envelope, where n is the sample number. Using a large enough value for n to cover a complete input cycle eliminates the possibility of locking onto harmonics.

The filters $H_I(z)$ and $H_Q(z)$ 12, 13 are implemented by the following recurrence relations. Each filter output calculation may require just three or four multiplications, and the common poles between $H_I(z)$ and $H_Q(z)$ reduce the number of constants that have to be calculated in order to adapt the centre frequency:

$$yi_k = y2_{k-1} \cdot c \cdot (1 + r^2) - yi_{k-2} \cdot r^2 + 0.5 \cdot (1 - r^2) \cdot (x_k - x_{k-2})$$

$$yq_k = yq_{k-1} \cdot c \cdot (1 + r^2) - yq_{k-2} \cdot r^2 + (1 - r^2) \cdot s \cdot x_{k-1}$$

Away from the centre frequency, the gain magnitude of $H_I(z)$ and $H_Q(z)$ are different and depend on the pole radius r. However, by ensuring that $H_O(z)$ and $H_I(z)$ are in phase with the input and by using the constant $\pi/2$ phase lag of $H_Q(z)$ from $H_I(z)$ when the centre frequency of the system equals the input frequency, the gains of each the first band pass filter 12 and the second band pass filter 13 can be equalized when the centre frequency $f_c$ equals the frequency of the signal $f_i$, i.e. the input frequency to the system 1. This results in greatly improved estimate of the phase angle increment per sample and very fast convergence to the input frequency.

$$(k \cdot yi)^2 + yq^2 = \text{constant}$$

$$k = \left| \frac{HQ(fi)}{HI(fi)} \right| \approx \sqrt{\frac{\sum yi^2 \sum yq^2 - n \cdot \sum (yi^2 yq^2)}{n \cdot \sum yi^4 - (\sum yi^2)^2}}$$

Using a value of n large enough to cover a complete input cycle would advantageously eliminate the possibility of locking onto harmonics.

The effect of gain equalization using a gain equaliser component in the system can be seen from FIG. 3. In this example, the selectivity of the filters is defined by the pole radius parameter, and in this particular case, r=0.6. Estimates of ω were taken after allowing the filter outputs to stabilize. k was calculated with n=10. The estimates with gain equalization appear as a point and are correct to 3 significant figures. As it can be seen, the estimate of the revised centre frequency in the case where gain equalisation is used is much more accurate than in the case where gain equalisation is absent.

The output phasor of the system 1 may be the complex combination of the gain-equalized $H_I(z)$ and $H_Q(z)$ filter outputs:

$$z = k \cdot yi + j \cdot yq$$

The ratio of successive output phasors gives the estimate of the input phase increment per sample, $\omega_{in}$.

$$\frac{z_i}{z_{i-1}} = (c + j \cdot s)' \approx \exp(j \cdot \omega_{in})$$

The filter parameters c and s are updated by averaging and normalizing these estimates:

$$c + j \cdot s = \frac{\sum (c + j \cdot s)'}{\sqrt{\sum (c')^2 + \sum (s')^2}}$$

The centre frequency is thereby driven towards the input frequency when the $H_I(z)$ filter output is in phase with the input and has unity gain. The amplitude A of the input fundamental can be obtained from the modulus of this phasor, and the input frequency can be obtained from the filter parameters:

$$A = \sqrt{yi^2 + yq^2}$$

$$f = \frac{f_s}{2 \cdot \pi} \cdot \arg(c + j \cdot s)$$

For rapid capture of a wide range of input frequencies, the initial centre frequency may preferably be fs/4.

This results in a symmetrical filter response with gain maxima at the centre frequency. The pole radius r should be low (0.6 for example) for initial capture.

As the centre frequency of the system approaches the input frequency, r can be increased to improve rejection of noise and harmonics and the precision of frequency measurement. Values of r close to 1 are required for low ω. A lower r value can be used for the pre-filter.

FIG. 2 shows a phase measurement system 2 that comprises two frequency tracking systems with a common control path (shown in dotted lines). Each frequency tracking system comprises an analogue to digital converter 20, 30 having a sampling frequency $f_s$, a pre-filter 21, 31 (optional) having a transfer function $H_O(z)$, two parallel band pass filters arranged in series with and after the pre-filter, the first band pass filter 22, 32 having a transfer function $H_I(z)$ and the second band pass filter 23, 33 having a transfer function $H_Q(z)$. The outputs of band pass filters 32 and 33 are combined as real and imaginary parts respectively to give a complex reference phasor. The outputs of band pass filters 32 and 33 may optionally be gain-equalised by a gain equaliser so that the phasors approximate a circle in the complex plane. Delay element 34 and divider 35 give the complex rotation of successive phasors. The complex rotations are averaged in block 36 and normalised to complex modulus=1 in block 37. The output of block 37 is c+j.s where c and s are the adjustable parameters of filters 21, 22, 23, 31, 32 and 33. The outputs of band pass filters 22 and 23 are combined as real and imaginary parts respectively to give a complex phasor which is compared to the reference phasor by complex divider 25. The output of divider 25 is then converted to a phase angle by an 'arg' operation in block 28.

A first signal can be input into the first analogue to digital converter 20 and a second signal can be input into the second analogue to digital converter 30. The first and second signals are then processed by the first set of filters 21, 22, 23 and the second set of filters 31, 32, 33 respectively. The relative phase between the two input signals can be measured by dividing the phasors of the two outputs.

The frequency tracking and phase measurement systems 1, 2 of the present invention can readily be adapted to measure harmonics. If the filter parameters for the fundamental are (c+j.s), the filter parameters for the nth harmonic are $(c+j.s)^n$, so a bank of filters can be tuned in parallel while tuning to the fundamental.

Further applications of the present invention include crystal balance frequency measurement, synchronization to mains frequency for inverters, heartbeat monitoring, and phase locked loop applications, just to name a few.

The invention claimed is:

1. A frequency analysis system, comprising:
   an analogue to digital converter having a sampling frequency $f_s$;
   a first band pass filter and a second band pass filter, the first band pass filter and the second band pass filter being arranged in parallel with one another; and
   a feedback loop from an output to an input of the system, wherein the system has an initial centre frequency equal to a nominal frequency $f_0$, and a revised centre frequency dependent upon the output of the system that is fed back into the input of the system,
   wherein transfer functions of the first and second band pass filters have the same poles,
   and wherein the system is configured such that, when the centre frequency $f_c$ equals the frequency of the signal $f_i$, the output of the first band pass filter is in phase with the input, the output of the second band pass filter lags the output of the first band pass filter at a constant phase of $\pi/2$ and the two band pass filters have equal gain amplitude.

2. The system according to claim 1, wherein the first band pass filter and/or the second band pass filter has unity gain.

3. The system according to claim 1, wherein the output of the system is the combination of the outputs of the two band pass filters.

4. The system according to claim 1, wherein the system further comprises a pre-filter arranged in series with and before the two parallel band pass filters.

5. The system according to claim 1, wherein each of the filters has the same centre frequency.

6. The system according to claim 1, wherein the system further comprises a gain equaliser arranged to equalise the outputs of the of the two band pass filters in use such that the output of the system is the combination of the gain equalised outputs of the two band pass filters.

7. The system according to claim 1, wherein the output of the second band pass filter lags the output of the first band pass filter at a constant phase of $\pi/2$ at all centre frequencies of the system.

8. The system according to claim 1, wherein the output of the system is a phasor.

9. The system according to claim 1, wherein the two band pass filters have parameters $c=\cos(\omega_c)$ and $s=\sin(\omega_c)$, wherein $\omega_c=2\pi \cdot f_c/f_s$ and said parameters c and s are revised according to the averaged and normalised ratio of successive outputs of the system.

10. The system according to claim 1, wherein the frequency $f_i$ of the input signal is calculated according to:

$$f_i=(f_s/2\cdot\pi)\arg(c+j\cdot s)$$

wherein $f_s$ is the sampling frequency $c=\cos(\omega_c)$, $s=\sin(\omega_c)$, $\omega_c=2\pi\cdot f_c/f_s$ and $c+j.s$ is the averaged and normalised ratio of successive outputs of the system.

11. The system according to claim 1, wherein the sampling frequency of the system is at least two times the initial centre frequency.

12. The system according to claim 1, wherein the pre-filter and each of the band pass filters have selectivity based upon the pole radius r of each of their respective transfer functions, and wherein $0 \leq r < 1$.

13. A method for analysing the frequency $f_i$ of a signal, comprising:
    inputting a signal with frequency $f_i$ into a system, wherein the system comprises an analogue to digital converter having a sampling frequency $f_s$, first band pass filter and a second band pass filter, the first band pass filter and the second band pass filter being arranged in parallel with one another, and a feedback loop from an output to an input of the system;
    setting an initial centre frequency of the system equal to a nominal frequency $f_0$;
    sampling the signal at sampling frequency $f_s$ using the analogue to digital converter;
    feeding back the output of the system into the input; and
    revising the centre frequency $f_c$ of the system based on the output of the system,
    wherein transfer functions of the first and second band pass filters have the same poles,
    and wherein the system is configured such that, when the centre frequency $f_c$ equals the frequency of the signal $f_i$, the transfer function of the first band pass filter is in phase with the input, the transfer function of the second band pass filter lags the transfer function of the first band pass filter at a constant phase of $\pi/2$, and the two band pass filters have equal gain amplitude.

14. The method according to claim 13, wherein the steps of sampling, feeding back and revising the centre frequency $f_c$ are iterated.

15. The method according to claim 13, wherein the method further comprises removing the DC component of the input signal $f_i$ using a pre-filter.

16. The method according to claim 13, wherein the method further comprises equalising the gains of the first and second band pass filters and combining the outputs of the two band pass filters such that the output of the system is the combination of the gain equalised outputs of the two band pass filters.

17. The method according to claim 13, wherein the method further comprises revising the parameters of the two band pass filters, $c=\cos(\omega_c)$ and $s=\sin(\omega_c)$, wherein $\omega_c=2\pi\cdot f_c/f_s$, according to the averaged and normalised ratio of successive outputs of the system.

18. The method according to claim 13, wherein the method further comprises determining the frequency $f_i$ of the input signal according to:

$$f_i=(f_s/2\pi)\arg(c+j\cdot s)$$

wherein $f_s$ is the sampling frequency $c=\cos(\omega_c)$, $s=\sin(\omega_c)$, $\omega_c=2\pi\cdot f_c/f_s$ and $c+j.s$ is the averaged and normalised ratio of successive outputs of the system.

19. The method according to claim 13, wherein the method further comprises setting the sampling frequency at least at two times the initial centre frequency.

20. The method according to claim 13, wherein the method further comprises adjusting the selectivity of the pre-filter and each of the band pass filters based upon the pole radius r of each of their respective transfer functions, and wherein $0 \leq r < 1$.

21. A phase measurement system, comprising two frequency analysis systems according to claim 1, wherein the relative phase of the two input signals is found by dividing the phasors of the two outputs.

* * * * *